United States Patent [19]

Eian et al.

[11] 4,369,244

[45] Jan. 18, 1983

[54] IMAGING PROCESS AND ARTICLE EMPLOYING PHOTOLABILE, BLOCKED SURFACTANT

[75] Inventors: Gilbert L. Eian, White Bear Lake; John E. Trend, Saint Paul, both of Minn.

[73] Assignee: Minnesota Mining and Manufacturing Company, St. Paul, Minn.

[21] Appl. No.: 177,287

[22] Filed: Aug. 11, 1980

[51] Int. Cl.[3] ............................................. G03C 1/90
[52] U.S. Cl. .................................. 430/257; 430/258; 430/259; 430/260; 430/262; 430/263; 430/18; 430/303; 430/306
[58] Field of Search ............... 430/258, 262, 263, 259, 430/260, 257, 270, 271, 275, 277, 278, 279; 428/202; 156/247

[56] References Cited

U.S. PATENT DOCUMENTS

| | | | |
|---|---|---|---|
| 3,060,023 | 10/1962 | Burg et al. | 96/29 |
| 3,203,805 | 8/1965 | Burg et al. | 96/115 |
| 3,353,955 | 11/1967 | Colgrove | 96/28 |
| 3,445,229 | 5/1969 | Webers | 96/28 |
| 3,469,982 | 9/1969 | Celeste | 96/35.1 |
| 3,591,377 | 7/1971 | Alsup | 96/35.1 |
| 3,607,264 | 9/1971 | Celeste et al. | 96/35.1 |
| 3,770,438 | 11/1973 | Celeste | 96/67 |
| 3,849,137 | 11/1974 | Barzynski et al. | 96/67 |
| 3,926,636 | 12/1975 | Barzynski et al. | 96/115 |
| 3,997,349 | 12/1976 | Sanders | 96/75 |
| 4,050,936 | 9/1977 | Takeda et al. | 96/35.1 |
| 4,075,175 | 2/1978 | Foss | 260/67 R |
| 4,086,210 | 4/1978 | Petropoulos | 260/67 R |
| 4,184,873 | 1/1980 | Noshiro et al. | 430/258 |
| 4,205,989 | 6/1980 | Moriya et al. | 430/306 |
| 4,210,711 | 7/1980 | Kitajima et al. | 430/258 |

OTHER PUBLICATIONS

Inou et al., *Nippon Shashin Gakkai-Shi*, vol. 41, No. 4, pp. 245-249, (1978).
Homma et al., *Nippon Shashin Gakkai-Shi*, vol. 41, No. 4, pp. 250-253, (1978), Komoto and Co. Ltd., Tokio, (German Pat. No. 2,716,422).
Berkower et al., *Photographic Science and Engineering*, vol. 12, No. 6, Nov.-Dec., pp. 283-287, (1967).
Woodruff et al., *Photographic Science and Engineering*, vol. 11, No. 2, pp. 93-97, Mar.-Apr., (1967).
Nakayama et al., *Society of Photographic Scientists and Engineers*, vol. 22, No. 3, pp. 138-141, May-Jun., (1978).
Amit et al., *Photosensitive Protecting Groups*, Israel J. of Chem., 12 (1-2), 103-113, (1974).

*Primary Examiner*—Won H. Louie, Jr.
*Attorney, Agent, or Firm*—Cruzan Alexander; Donald M. Sell; Richard Francis

[57] ABSTRACT

A photosensitive element is provided by an actinic radiation-transmissive film-forming polymeric material which contains photolabile blocked surfactant capable upon exposure to actinic radiation of releasing a detectable quantity of surfactant in actinic radiation exposed areas in areas not exposed to actinic radiation and unblocked surfactant in an image-wise pattern in the actinic radiation exposed areas. An imaging process is also provided comprising providing the actinic radiation-sensitive element and exposing the actinic radiation-sensitive element to actinic radiation in an image-wise pattern at an intensity and for a time sufficient to release an image-wise pattern of released surfactant in the exposed area.

7 Claims, 14 Drawing Figures

IMAGING PROCESS AND ARTICLE EMPLOYING PHOTOLABILE, BLOCKED SURFACTANT

DESCRIPTION

1. Technical Field

This invention relates to graphic arts and particularly to improved photosensitive elements and imaging processes comprising photolabile blocked surfactants.

2. Background Art

Photosensitive elements suitable for use in printing plates and information recording films are well known and the subject of a great many publications and patents. Since the advent of photopolymer chemistry about 35 years ago, increasing effort has been made to displace silver halide as the photosensitive material in photosensitive elements with more or less success. Most of these non-silver containing photosensitive elements have utilized compositions containing moieties which polymerize on exposure to suitable radiation to yield polymer in exposed areas of the element. On development of the exposed element with a solvent, the composition in unexposed areas can be removed to produce a developed element that may be used as a printing plate, a projection transparency or for information recording and the like. Photosensitive elements utilizing photopolymerization are less than desirable because image contrast attainable is generally low and because of the necessity of using solvents to develop the image.

3. Disclosure of Invention

In accordance with the present invention, there is provided a non-silver process for formation of images and imaged articles which does not rely on photo-induced polymerization. Therefore, the present process avoids the above-mentioned problems attendant with photo-induced polymerization. The process and articles of the inventions employ as the photosensitive element a photolabile blocked surfactant. The articles of the invention may provide driographic- and lithographic-type printing plates, projection transparencies, and high resolution information recording films.

The photolabile blocked surfactants useful in the present invention are surfactants (i.e., compounds characterized by having a hydrophobic group and at least one polar hydrophilic group) having the polar group(s) masked by a covalently bonded labile masking group. Because of the photolabile mask, the masked surfactant has substantially reduced surfactant activity as compared to the same surfactant in the unmasked state and, on exposure to suitable radiation, the mask is removed, substantially restoring the surfactant to its original surface activity.

Specifically, the photolabile surfactant compounds useful in the present invention have the general formula $(P-X)_a R$ wherein $(-X)_a R$ is the hydrogen-eliminated residue of a surfactant having the formula $(H-X)_a R$ including the polar divalent radical X, P is a covalently bonded photolabile masking group which prior to exposure to actinic radiation masks the polar properties of X and upon exposure to actinic radiation will unmask the polar properties of X, and R is a hydrophobic group which provides in the surfactant $(H-X)_a R$ a log (critical micelle concentration, hereinafter designated "CMC") equal to or less than $-2$ and "a" is a number from 1 to 4 to satisfy the valency of R.

The process of the invention comprises at least two basic steps. The first step involves providing an actinic radiation-sensitive film or layer comprising a blend of an actinic radiation-transmissive film-forming polymeric material and photolabile blocked surfactant capable upon exposure to actinic radiation of releasing a detectable amount of surfactant in the exposed areas. The film may be a self-supporting sheet or as a layer carried on an appropriate support or one layer in a multi-layered construction. The second step involves exposing the actinic radiation-sensitive layer to actinic radiation in an image-wise pattern at an intensity and for a time sufficient to provide an image-wise pattern of released surfactant in the exposed area. By these steps, an article is obtained comprising a film or layer within a construction having surface areas of differential oleophobicity because of the higher concentration of released surfactant in the exposed areas than in the unexposed areas.

A driographic ink having a greater affinity for the exposed surfactant-containing areas than the non-exposed areas may be applied to the surface of the exposed film to develop the exposed image or to provide a negative (reversal) image which may be transferred from the film surface to another substrate such as paper. Alternatively, the driographic ink and film binder may be selected such that the ink has a greater affinity for the unexposed areas than for the exposed areas and thereby utilized to produce a positive image which may also be transferred to another substrate.

In another aspect, the process comprises the two basic steps described above, except that the actinic light sensitive film is as a layer coated on a support which is selected so that it has the ability to retain released surfactant on its surface. The process includes the additional step of separating the exposed actinic radiation-sensitive layer from the support. By this step, an article is obtained comprising the support having released surfactant in an image-wise pattern but otherwise being substantially free of surfactant in unexposed areas. The image of the resultant article (the surfactant-imaged support) may be developed with driographic ink as described above or with a lithographic ink with a fountain solution.

In yet another aspect of the invention, the process involves providing a support layer and an actinic radiation-sensitive layer which are selected so that the adhesion of the actinic radiation for the support layer is greater in unexposed areas than in exposed areas. The next process step involves in either order exposing the actinic radiation-sensitive layer to actinic radiation and applying to the actinic radiation-sensitive layer an adherent layer. The adherent layer must be actinic radiation-transmissive if applied prior to exposure. The materials are selected so that the exposed area of the actinic radiation-sensitive layer has greater adhesion for the adherent layer than for the support layer, and the adhesion of the unexposed area of the actinic radiation-sensitive layer is greater for the support layer than for the adherent layer and the cohesion of the actinic radiation-sensitive layer is (1) greater than the adhesion between the exposed area of the actinic radiation-sensitive layer and the support layer, (2) greater than the adhesion between the unexposed areas and the adherent layer, and (3) less than the adhesion between the unexposed area of the actinic radiation-sensitive layer and the support layer. The next step involves separating the adherent layer from the exposed article to cause separation of the actinic radiation-sensitive layer remaining bonded as a negative image (corresponding to the actinic radiation pattern) to the adherent layer. The image may then be developed by applying dye or toner powder to either or both the negative image-bearing adherent layer and the positive image-bearing support.

In a further aspect of the invention, the process comprises providing a four-layered construction comprising a radiation-transmissive support layer having thereon an actinic radiation-sensitive layer which has thereon a frangible-dyed or -opaque layer which is covered by an adherent layer. The various layers are selected of materials such that (1) the adhesion between the actinic radiation-sensitive layer and the support layer is less in exposed areas than in unexposed areas, (2) the adhesion between the exposed area of the actinic radiation-sensitive layer and the support layer is less than the adhesion between the frangible layer and the adherent layer, (3) the adhesion between the adherent layer and the frangible layer is less than the adhesion between the unexposed area of the actinic radiation-sensitive layer and the support layer, (4) the adhesion between the frangible layer and the exposed and unexposed areas of the actinic radiation-sensitive layer is greater than the adhesion between any other layers and (5) the cohesion of the frangible layer is (a) greater than the adhesion between the support layer and the exposed area of the actinic radiation-sensitive layer and (b) greater than the adhesion between the frangible layer and the adherent layer and (c) less than or equal to the adhesion between the radiation-sensitive layer and the frangible layer. The process then involves exposing the actinic radiation-sensitive layer to an image-wise pattern through the radiation-transmissive support and separating the adherent layer from the support layer. This produces an imaged adherent layer having a positive image of opaque or dyed material derived from the frangible layer and an imaged radiation-transmissive support layer bearing the actinic radiation-sensitive layer having a negative opaque or dyed image also derived from the frangible layer which would provide a useful overhead transparency.

In a further aspect of the invention, the process comprises providing a three-layered construction comprising a support layer, an intermediate frangible layer, and an actinic radiation-sensitive layer. The actinic radiation-sensitive layer is then exposed in an image-wise pattern to actinic radiation and an adherent layer is applied to the exposed actinic radiation-sensitive layer. If the adherent layer is actinic radiation-transmissive, the exposure may be either before or after application of the same to the actinic radiation-sensitive layer. The various layers are selected of materials such that (1) the adhesion between the actinic radiation-sensitive layer and the frangible layer is greater in unexposed areas than in exposed areas, (2) the adhesion between the exposed area of the actinic radiation-sensitive layer and the frangible layer is less than the adhesion between the frangible layer and the support layer, (3) the adhesion between the unexposed area of the actinic radiation-sensitive layer and the frangible layer is greater than the adhesion between the frangible layer and the support layer, (4) the adhesion between the adherent layer and the exposed and the unexposed areas of the actinic radiation-sensitive layer is greater than the adhesion between any other layers, and (5) the cohesion of the frangible layer is such that it separates at the lines defining the image. After exposure and application of the adherent layer, the layers are separated to provide the support layer bearing the negative image derived from the frangible layer and a two-layered construction of the adherent layer bearing the actinic radiation-sensitive layer which has on its surface a positive image derived from the frangible layer.

It should be noted that the mobility of released surfactant may be increased upon application of heat, either during or after exposure. In still a further aspect of the invention, the process comprises first providing a three-layered construction having a support layer, an intermediate frangible layer, and an actinic radiation-sensitive layer. The frangible layer may be translucent, transparent, but preferably is opaque. The actinic radiation-sensitive layer is then uniformly exposed to actinic radiation to provide released surfactant throughout. The uniformly exposed actinic radiation-sensitive layer is then further exposed to an image-wise pattern of thermal radiation. The materials are selected so that (1) the adhesion between the frangible layer and the actinic radiation-sensitive layer is greater in non-thermally exposed areas than in thermally exposed areas, (2) the adhesion between the thermally exposed area of the actinic radiation-sensitive layer and the frangible layer is less than the adhesion between the frangible layer and the support layer, (3) the adhesion between the non-thermally exposed area of the actinic radiation-sensitive layer and the frangible layer is greater than the adhesion between the frangible layer and the support, and (4) the cohesion of the frangible layer is greater than (a) the adhesion between the frangible layer and the thermally exposed area of the actinic radiation-sensitive layer and (b) the adhesion between the frangible layer and the support layer. An adherent layer having adhesion to the exposed and the unexposed areas of the actinic radiation-sensitive layers greater than the adhesion between the other layers is applied to the imaged actinic radiation-sensitive layer, and the adherent layer is separated from the construction. This causes the frangible layer to separate producing an imaged support having a positive image derived from the frangible layer corresponding to the thermally exposed area and, if the support is transparent to visible light, transparent areas corresponding to thermally unexposed areas, providing a unique visual transparency.

DESCRIPTION OF THE DRAWING

The invention is further illustrated by reference to the accompanying drawings wherein each view is a greatly enlarged elevational view in cross-section and.

DETAILED DESCRIPTION

Figure 1:
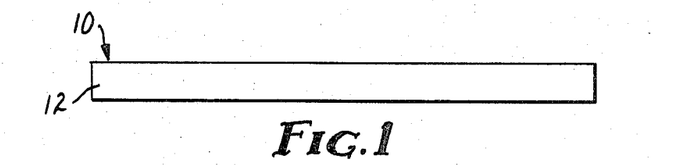
FIG. 1 is an actinic radiation-sensitive film useful in the present invention.
Figure 2:
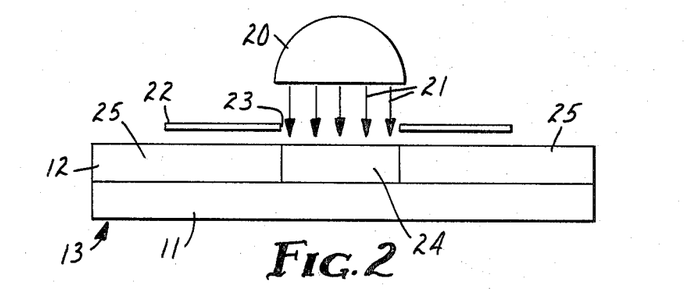
FIG. 2 is a construction comprising a support layer bearing an actinic radiation-sensitive layer which is being exposed to actinic radiation in an image-wise pattern.

Referring now to FIG. 1, there is shown a self-supporting film 10 of actinic radiation-sensitive sheet 12 comprised of a film-forming binder containing a photolabile surfactant capable of releasing surfactant in an image-wise pattern upon exposure to actinic radiation. FIG. 2 shows the actinic radiation-sensitive layer 12 coated upon support layer 11, e.g., a film to provide layered construction 13. Actinic radiation-sensitive layer 12 is capable upon being exposed by actinic radiation source 20 with actinic radiation 21 in an image-wise pattern by utilizing a suitable device 22 having an image-wise pattern opening 23 capable of permitting the passage of actinic radiation. Upon exposure, actinic radiation-sensitive layer 12 is characterized by having a higher concentration of released surfactant in exposed area 24 than in unexposed area 25.

Figure 3:
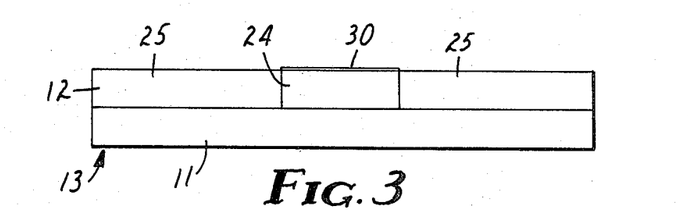
FIG. 3 is the exposed construction of FIG. 2 developed to provide a visible image pattern.
Figure 4:
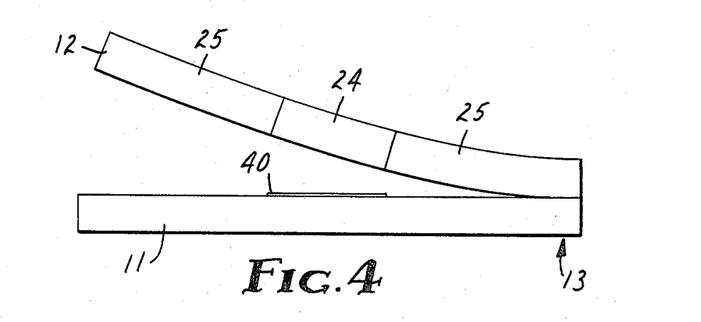
FIG. 4 is another embodiment of the invention showing the actinic radiation-sensitive layer being separated from a support layer bearing a developed image-wise pattern of surfactant.
Figure 5:
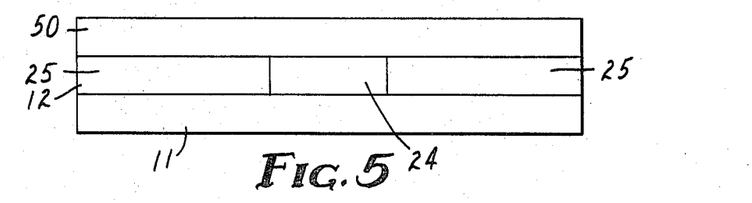
FIG. 5 is yet another embodiment of the present invention comprising a support layer, an intermediate actinic light-sensitive layer which has been exposed to actinic radiation and an adherent layer.

Upon exposure, the surface of the actinic radiation-sensitive layer may be developed by application of a suitable material, e.g., ink or toner to provide developed layer 30. Alternatively, the actinic radiation-sensitive layer 12 and support layer 11 may be selected such that layer 12 may be separated from support layer 11, as shown in FIG. 4, leaving an image-wise pattern of surfactant on the surface of support 11 which also may be developed by application of a suitable ink or toner to provide image-wise developed layer 40.

Figure 6:
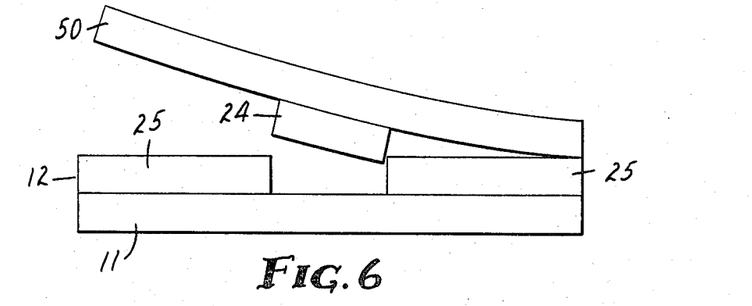
FIG. 6 shows the exposed article of FIG. 5 with parts being partially separated to reveal image patterns.
Figure 7:
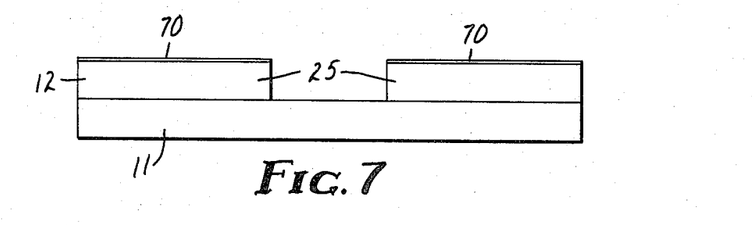
FIGS. 7 and 8 respectively show the separated parts of the embodiment of FIG. 6 with each of the image patterns being developed.
Figure 8:
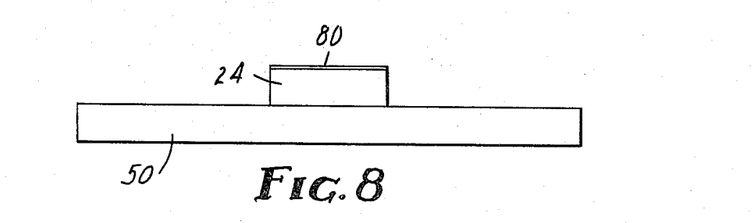

Alternatively, as shown in FIGS. 5–8, an adherent layer 50 may be applied to the surface of exposed actinic radiation-sensitive layer 12 and the respective layers selected of materials so that the adhesion of the actinic radiation-sensitive layer 12 for the support layer 11 is greater in unexposed areas 25 than in exposed areas 24 and the adhesion between adherent layer 50 and actinic radiation-sensitive layer 12 is greater than the adhesion of the actinic radiation sensitive layer for the support in exposed areas 24, but less than in unexposed areas 25. Separating adherent layer 50 from the construction will separate actinic radiation-sensitive layer 12, as shown in FIG. 6, leaving support layer 11 bearing a negative image area 25 of actinic radiation-sensitive layer and adherent layer 50 bearing a positive image area 24 of the actinic radiation-sensitive layer. As shown in FIGS. 6 and 7, respectively, each of the separated parts may be developed to provide a developed positive image pattern 70, as shown in FIG. 7, or negative developed image pattern 80, as shown in FIG. 8.

Figure 9:
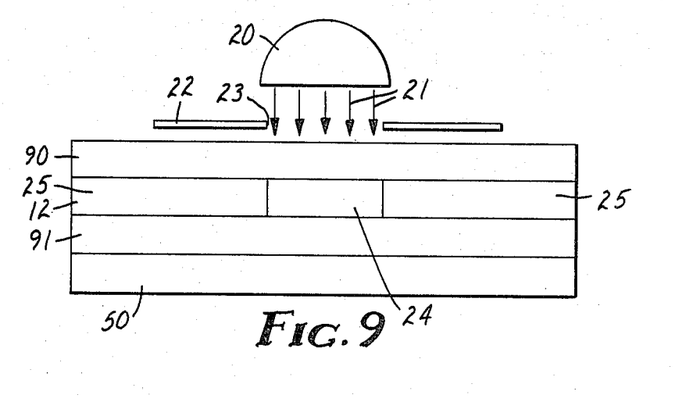
FIG. 9 shows yet another embodiment of the present invention comprising an adherent base layer bearing a frangible layer having thereon an actinic light-sensitive layer which is being imaged with actinic radiation through an actinic radiation-transmissive support layer.
Figure 10:
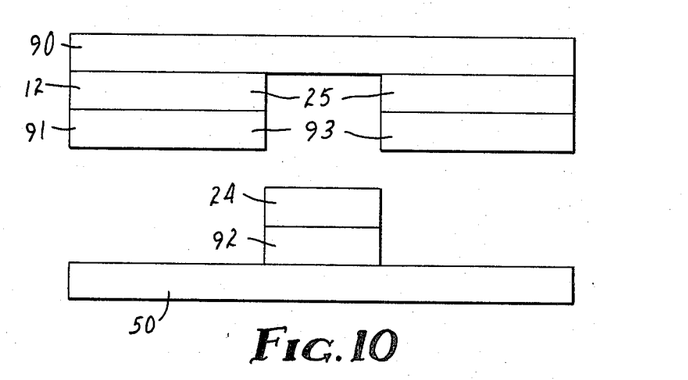
FIG. 10 shows the exposed article of FIG. 9 being separated into parts.

Referring now to FIG. 9, there is shown a four-layered construction 100 comprising adherent layer 50, frangible layer 91, actinic radiation-sensitive layer 12, and actinic radiation-transmissive support layer 90. Exposing actinic radiation-sensitive layer 12 to actinic radiation through support layer 90 produces negative image pattern 24 and positive pattern 25. Separation of the support layer 90 from adherent layer 50 results in a separation of frangible layer 91, as shown in FIG. 10. The materials are selected so that the adhesion of the actinic radiation-sensitive layer 12 for the support layer 90 is less in exposed areas than in unexposed areas, a separation will occur as depected in FIG. 10 wherein area 92 of the frangible layer adjacent and exposed area 24 of actinic radiation-sensitive layer 12 separate from the support remaining bonded to adherent layer 50, leaving positive image 93 of frangible layer 91 and adjacent unexposed area 25 adhered to the support layer 90.

Figure 11:
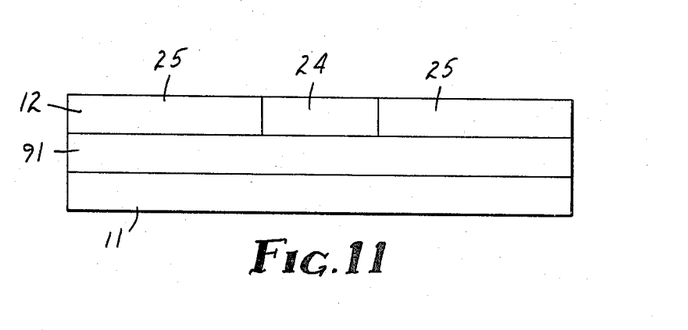
FIG. 11 shows yet another embodiment of the present invention comprising a support layer, an intermediate frangible layer and an actinic radiation-sensitive layer which has been exposed to an image-wise pattern.
Figure 12:
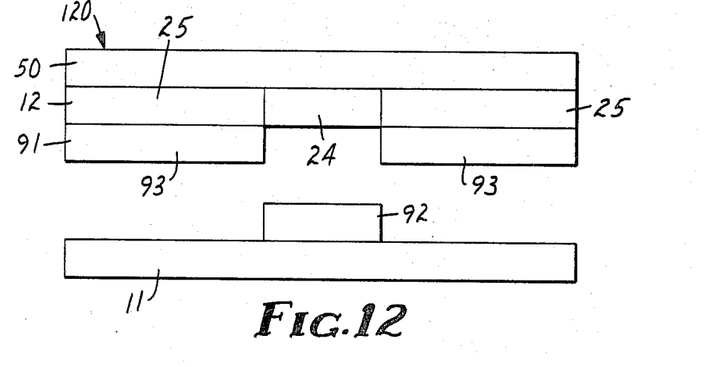
FIG. 12 shows the embodiment of FIG. 11 having had an adherent layer applied to the exposed actinic radiation-sensitive layer and being separated to cause image-wise separation of the frangible layer.

Referring now to FIG. 11, there is shown a three-layered construction 120 comprising support 11, intermediate frangible layer 91 and actinic radiation-sensitive layer 12. Exposing actinic radiation-sensitive layer 12 to actinic radiation produces negative image pattern 24 and positive image pattern 25. Application of adherent layer 50 to exposed actinic radiation-sensitive layer 12 and separation of adherent layer 50 and support layer 11 causes construction 120 to separate as shown in FIG. 12, leaving negative image 92 adherently bonded to the support and leaving positive image 93 adherently bonded to a two-layered construction of adherent layer 50 and exposed actinic radiation-sensitive layer 12, both image pattern 93 and 92 being obtained from frangible layer 91.

Figure 13:
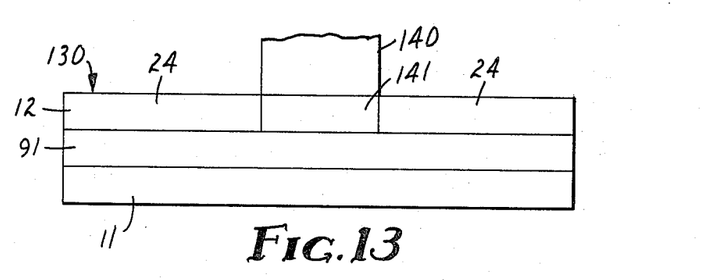
FIG. 13 shows yet another embodiment of the present invention comprising a support layer, an intermediate frangible layer and an actinic radiation-sensitive layer which has been uniformly exposed to actinic radiation and is being thermally imaged in an image-wise pattern.
Figure 14:
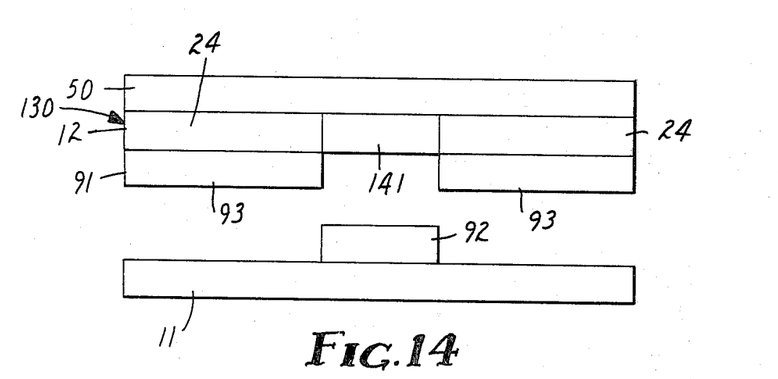
FIG. 14 shows the embodiment of FIG. 13 after application of an adherent layer and separation.

Referring now to FIGS. 13 and 14, there is shown a three-layered construction 130 comprising support 11, intermediate frangible layer 91 and actinic radiation-sensitive layer 12 which has been exposed to actinic radiation uniformly to provide exposed areas 24 and which has also been heated by heated element 140 to provide image pattern 141 which is characterized by having a lower adhesion for frangible layer 91 than areas 24 have for frangible layer 91. Application of adherent layer 50 to the exposed surface and separation of the layers results in the construction shown in FIG. 14, leaving support layer 11 bearing negative image pattern 92 and the two-layered construction of adherent layer 50 and actinic radiation-sensitive layer 12 bearing positive image 93, both being obtained by separation of frangible layer 91.

The photolabile blocked surfactants and the film-forming binder suitable for use in the actinic light sensitive layer of the present invention are described in assignee's copending application U.S. Ser. No. 177,288 filed Aug. 11, 1980 concurrently herewith on the same date as the present application. The disclosure of said application is incorporated herein by reference for the description of the photolabile blocked surfactant, the film-forming binder materials and the process of coating blends of these to produce actinic light-sensitive layers.

As described in that application, useful surfactants are those which, in their salt form, are commonly known as ionic surfactants. Suitable ionic surfactants are those having one or more salt-forming polar group including carboxylic, sulfonic, phosphonic, phosphinic, sulfinic, amino and the like polar groups.

Suitable photolabile masking groups for use in the photolabile blocked surfactants (sometimes referred to as photoactivatable release agents) of the invention are any of the photolabile masking groups (often termed protecting groups) recognized in organic chemistry, particularly the chemistry of aminoacids. Examples of such protecting groups include 2-nitrobenzyl, phenacyl, decyl, 2-nitroanilino, 2,4-dinitrobenzenesulfenyl, 2-(2-azidoaryl)ethyl, 7-nitroindolino, β-nitrocinnamyl, and 8-nitrotetrahydroquinolino groups that can be substituted by one or more auxochromic or bathochromic groups.

Preferred photolabile blocked surfactants of the invention include those of the formula $(P—X)_a R$ wherein:

P is defined above; and
X is a polar group selected from wherein $R^1$ is selected from hydrogen and lower alkyl having one to four carbon atoms;
R is selected from:

wherein $R^2$ is:

(1) a straight chain alkyl, alkenyl, alkynyl or alkylphenyl group having 12 to 30 carbon atoms when X is:

(2) a straight chain alkyl, alkenyl, alkynyl or alkylphenyl group having 15 to 30 carbon atoms when X is:

wherein $R^1$ is defined above; or
(3) a perfluoroalkyl, -alkenyl, or -alkynyl group having 7 to 30 carbon atoms;

$R^3$ is a straight chain alkyl, alkenyl, alkynyl or alkylphenyl or group having 11 to 30 carbon atoms or a perfluoralkyl group having 7 to 30 carbon atoms;

$R^4$ is a straight chain alkyl, alkenyl, alkynyl, alkylphenyl or perfluoroalkyl, -alkenyl, or -alkynyl group having 7 to 30 carbon atoms;

n is 1 or 2; and
a is 1.

The most preferred photolabile blocked surfactants of the invention have the general formulae:

IIa

IIb

IIc

IId

IIe wherein X, R and $R^1$ are as defined above;

$Ar^1$ is a mononuclear or polynuclear divalent aryl group having 6 to 14 carbon atoms or heteroaromatic group having 5 to 13 carbon atoms with heteroatoms selected from oxygen, nitrogen or sulfur atoms, the nuclei of which may be substituted by one or more auxochromic or bathochromic groups, examples of which include nitro, chloro, bromo, phenyl, lower alkyl, lower alkoxy, lower thioalkoxy, amino, lower alkyl or dialkylamino, and the like groups and the aryl group $Ar^1$ may be the aryl group in a polymer;

$Ar^2$ is preferably the same as $Ar^1$ except that $Ar^2$ is monovalent;

$R^5$ is preferably hydrogen but may be lower alkyl or phenyl which may also be substituted by an auxochromic or bathochromic group as defined for Ar, or a lower alkylene group joining CH to Ar and forming a five- or six-membered heterocyclic ring;

$R^6$ is preferably phenyl substituted by 3-alkoxy or 3,5-dialkoxy in which the alkyl group has 1 to 4 carbon atoms but can be a hydrogen atom, a lower alkyl group, e.g., having from 1–3 carbon atoms, or a phenyl group;

$R^7$ can be hydrogen but preferably is lower alkyl having 1 to 4 carbon atoms or most preferably is lower alkylene having 2 to 4 carbon atoms joining N to $Ar^1$ forming a five- or six-membered heterocyclic ring; and b is zero or one.

A simple infrared spectroscopic analysis technique may be employed to identify the suitable photolabile covalently bonded blocked surfactants of the present invention. In this technique, a small amount (e.g., about 10–100 mg) of the test photolabile blocked surfactant (as a thin liquid film or as a mull in mineral oil) is analyzed to obtain an infrared spectrum. The sample is thereafter exposed to an ultraviolet source (e.g., using an H3T7 lamp from a distance of 5 cm) for a brief length of time and a second IR spectrum is obtained of the UV exposed sample. Useful compounds will show a change in the infrared spectrum due to breaking of the covalent bond and liberation of the polar group of the unblocked surfactant after UV light exposure. The UV light exposure time needed to cause this change will generally depend on several factors including the photosensitivity of the test compound, film thickness, etc. Generally, exposures of from 5 to 50 minutes will be sufficient and 15–30 minute exposures are more common.

The film-forming binder component of the actinic radiation-sensitive layer of the construction of the invention are thermoplastic organic polymers preferably having a molecular weight of at least 10,000. Suitable polymers include: (a) copolyesters based on terephthalic, isophthalic, sebacic, adipic and hexahydrophthalic acids such polyesters sold under the trade designation "Vitel" by the B. F. Goodrich Company, (b) polyamides such as poly(hexamethyleneadipamide) and polycaprolactam, (c) vinyl acetate polymers such as that available under the trade designation "VINAC" ASB516 from Air Products Company and vinyl chloride copolymers such as the copolymer with vinyl acetate, e.g. that sold under the trade designation "VMCH", VAGH", or "VYHH" by the Union Carbide Company and under the trade designation "Geon" resin by the B. F. Goodrich Company, (d) vinyldine chloride copolymers (e) ethylene copolymers, e.g., ethylene or proylene and vinyl acetate, (f) polyacrylates such as polymethyl and methacrylate and the copolymers of acrylic acid esters with other ethylenically unsaturated monomers, e.g., that sold under the trade designation "Carboset 525" by the B. F. Goodrich Company and methacrylate resins such as that sold under the trade designation "Elvacite" by the duPont Company, the pressure sensitive adhesive copolymers of "soft" acrylic esters such as butyl or isooctyl acrylate and a "hard" monomer such as acrylic acid or acrylamide, (g) cellulose esters such as cellulose acetate/butyrate, (h) polyvinyl acetals such as polyvinyl butyral, (i) polyurethanes, (j) the polycarbonates, and (k) styrene-maleic anhydride or maleic acid copolymers.

Suitable supports for bearing the actinic light sensitive layer include glass, metal, ceramic, paper and polymeric supports. The form of the support may be any form and its should be selected depending upon the particular application of the process or article. The preferred supports are flexible sheets. Particularly suitable supports are polyester, polyolefin, polyamide films, polyvinyl chloride, polyvinylidene chloride and polyvinylidene fluoride.

Suitable frangible layers include layers of metal, oxide and dyed or pigmented polymeric material. The metal or metal oxide layers may be electro-, chemically-, sputter-, or preferably vapor-deposited singly or in successive combination. Suitable metals and metal oxides include aluminum, aluminum oxide, copper gold, nickel, silicon oxide, tin, zinc, etc. Useful thickness as of such layers may vary from 50 to 4000 Å, preferably 250 to 1500 Å, depending on the desired image density and the specific layer.

Suitable adherent layers are provided by flexible foils, films and other sheet goods having at least one surface which is inherently adhesive or is coated with a layer of adhesive material such as a layer of pressure-sensitive adhesive material. A preferred adherent layer is provided by a layer of polymeric film coated with a pressure-sensitive adhesive material such as an arylate-type pressure-sensitive material, e.g., that disclosed in Ulrich (U.S. Pat. No. Re. 24,906), assigned to the present assignee.

Suitable development dyes and toners which have a high affinity for the actinic light-sensitive layers include basic dyes such as auramine, Intradene yellow, Rhodamine, Safranine T, and Crystal Violet, and toners such as those sold under the trade designations "Magna" Dry Type 842 and 361; "Magna Dynamic" and "ESP" by the assignee of the present application.

The composition forming the actinic light sensitive layer may be prepared by mixing by any convenient method the film-forming binder and photolabile surfactant in a suitable solvent. The ratio of the photolabile surfactant to film-forming binder will be on the order of 1:100 to 10:100, preferably 2:100 to 4:100. Solutions are prepared to contain about 10 to 50 weight percent concentration of solids, the concentration used being that which provides a solution having a viscosity more suitable to the method by which the composition is applied to the support.

Solvents for use in the coating composition are chosen on the basis of the film-forming binder. Suitable solvents include ketones such as acetone, methylethylketone, and methylisobutyl ketone; aromatic hydrocarbons such as benzene and toluene; halocarbons such as chloroform, methylene chloride, and trichloroethylene; esters such as ethyl acetate and propyl butyrate; ethers such as diethyl ether, dioxane, and tetrahydrofuran; nitromethane; nitroethane; and acetonitrile.

The coating may be applied to the substrate by any conventional means, including spray, brush, dip pad, roll coating, curtain and knife techniques, and may, if desired, be dried under ambient or other conditions to provide the actinic light sensitive layer. The coating thickness, after drying, will be on the order of 0.5 to 50 micrometers, preferably 1 to 10 micrometers.

Various additives may be included in the actinic light sensitive layer to accomplish various purposes. For example, photosensitizers may be added to broaden the exposure sensitivity of the actinic light sensitive layer. Various other additives common to the photographic and lithographic arts may also be added for known purposes.

In the process of the invention, the construction may be exposed to any source of radiation emitting actinic radiation at a wavelength within the ultraviolet and visible spectral regions. Suitable sources of radiation include mercury, xenon, carbon arc and tungsten filament lamps, lasers, sunlight, etc. Exposures may be from less than about 1 second to 10 minutes or more depending upon the amounts of the particular photolabile blocked surfactant being utilized and depending upon the radiation source, distance from the source, and the thickness of the active radiation-sensitive layer.

The invention is further illustrated by the following examples wherein all parts are by weight, unless otherwise specified.

EXAMPLES 1–6

Examples 1–6 illustrate the preparation of driographic printing plates utilizing photolabile surfactants according to the invention.

A series of solutions were prepared to contain 5% by weight of photolabile surfactant based on binder by adding 0.025 g of the photolabile blocked surfactant to 5 g of 10% solutions of the binder. The solutions were coated onto anodized, silicated aluminum and the coatings dried at 65° C. Table I gives the photolabile blocked surfactant (designated PR Agent), binder and solvent used for preparing each coating. The coatings were exposed for 3-5 minutes at a distance of 5 to 18 cm through a metal stencil to the irradiation from a G.E. H3T7 source. Using a rubber roller, each exposed coating was then inked with DRK driographic ink (available form L. O. Wernecke Company, Minneapolis, Minn.).

TABLE I

| Ex. No. | PR Agent | Binder Trade Designations | Solvent | Ink Action |
|---|---|---|---|---|
| 1. | 2-Nitrobenzylperfluorooctanoate | "Kraton" 1101[1] | Toluene | Pos.[4] |
| 2. | 3'-Methoxybenzoin perfluorooctanoate | "Kraton" 1101 | Toluene | Pos. |
| 3. | 4,5-Dimethoxy-2-nitrobenzyl perfluorooctanoate[7] | "Kraton" 1101 | Toluene | Pos. |
| 4. | 4,5-Dimetnoxy-2-nitrobenzyl perfluorooctanoate[7] | "Kraton" G-1652[2] | Toluene | Pos. |
| 5. | 2-Nitrobenzyl hexadecanesulfonate | "Emerez" 1537[3] | Ethanol | Neg.[5] |
| 6. | 2-Nitrobenzyl perfluorobutanoate | "Kraton" 1101 | Toluene | None[6] |

[1]Polystyrene-butadiene copolymer available from Shell Chemical Company.
[2]Polystyrene-poly(ethylene-butylene) copolymer available from Shell Chemical Company.
[3]Polyamide resin available from Emery Industries, Inc.
[4]Ink adheres to unirradiated areas but not to irradiated areas.
[5]Ink adheres to irradiated areas but not to unirradiated areas.
[6]Ink adheres to both irradiated and non-irradiated areas. Compound liberated in irradiated areas does not appreciably change the characteristic of the binder for being wet by ink.
[7]Can be imaged with a Berkey Ascor 2 kW exposure unit through a lithographic film original.

EXAMPLE 7

This example illustrates the preparation of an adhesive image on an aluminum foil support.

Into 4.0 g of a 25% solution of pressure-sensitive adhesive [poly(2-methylbutylacrylate/acrylic acid)-90/10] in acetone-heptane was mixed 0.025 g of 2-nitrobenzyl hexadecanesulfonate in 4.0 g of methyl ethyl ketone. The resulting adhesive solution was knife coated at a 50 µm orifice onto 50 µm polyester film. The coating was air dried and the coated film cut into strips. Strips were then placed coated side down onto strips of aluminum and, while heating the aluminum gently with a hot air gun, were pressed with a hard rubber roller. The polyester surface of the polyester/adhesive/aluminum laminate construction was exposed through a metal stencil to the irradiation from a G.E. H3T7 medium pressure mercury lamp at a distance of 3 to 5 cm for one minute. The polyester film was then peeled from the aluminum strip at a 180° angle and a pull rate of about 5 to 20 cm/sec. A positive image (from the unexposed areas) of the stencil in adhesive was obtained on the aluminum strip and the complementary negative image (exposed areas) of the stencil in adhesive remained on the polyester layer. The adhesive images could be enhanced by toning with toner powder or by dyeing with basic dyes.

Similar results are obtained with laminates prepared by coating the adhesive solution onto aluminum, allowing the coating to dry, and laminating the polyester film to the coating.

Laminates made as described above but not using a photolabile surfactant in the adhesive layer did not yield images.

Examples 8 and 9 illustrate other constructions for preparing adhesive images on metal carriers.

EXAMPLE 8

An adhesive solution composed of poly(isooctylacrylate-acrylic acid)-95/5, 32% in heptane and containing 10% 2-nitrobenzyl heptadecanoate based on solids was knife coated at 50 µm orifice onto polyester film. The coating was air dried and pressed adhesive side down onto Parker Bonderite 40 phosphated steel panels*. The constructions were irradiated for six minutes at 2.5 cm with a G.E. H3T7 lamp through a metal stencil. The polyester film was peeled at 180° to reveal a positive image of adhesive on steel (adhesive is released from the steel in exposed areas) and a complementary positive image simultaneously on the polyester peel-off layer.

*"Bonderite" #40 is the trade designation of the Oxy-Metal Industries, Parker Division for a phosphate surface treatment for unpolished cold rolled steel test panels.

EXAMPLE 9

Example 8 was repeated using in place of 2-nitrobenzyl heptadecanoate, 3'-methoxybenzoin perfluorooctanoate as photolabile surfactant. Adhesive images similar to those obtained in Example 8 were prepared.

EXAMPLES 10-13

A methylethyl ketone solution containing 15% "Vitel" PE-222 (a polyester resin available from Goodyear Chemicals, Inc.) as binder resin and 0.95 g of 4,5-dimethoxy-2-nitrobenzyl octadecanoate (6% by weight of solids in the solution) as PR Agent was coated with a No. 25 coating rod onto a sheet of aluminized polyester (450 Å thick layer of vapor coated aluminum on a 75 µm thick polyester base). The air dried (30 minutes) sample was exposed through a lithographic film negative for three minutes in a Berkey Ascor 2 kW unit with #1406-02 photopolymer bulb at 45 cm distance and then heated in an oven for one minutes at 55° C. The construction was then developed by applying the adhesive surface of a pressure-sensitive adhesive sheet to the resin coating and peeling the adhesive sheet versus the base. Resin coating and aluminum were removed with the adhesive sheet in unexposed areas and resin only in the exposed areas, leaving underlying aluminum to create a negative aluminum image (i.e., reversal) of the mask on the polyester base. A complementary positive image comprised of aluminum was created on the adhesive sheet. Alternative PR Agents substituted for 4,5-dimethoxy-2-nitrobenzyl octadecanoate at a 0.45% loading level (3% by weight of solids) gave similar results with the indicated times and a 1.5 minutes postexposure heating at 55° C. (Table II).

TABLE II

| Ex. No. | PR Agent | Exposure Time |
|---|---|---|
| 11 | 4,5-Methylenedioxy-2-nitrobenzyl perfluorooctanoate | 1.1 min |
| 12 | 4,5-Dimethoxy-2-nitrobenzyl-N—octadecanoylsarcosinate | 3 min |
| 13 | 4,5-Dimethoxy-2-nitrobenzyl hexadecanesulfonate. | 0.75 min |

EXAMPLE 14

The construction in Example 13 was also developed by foregoing the oven heating step and proceeding as follows. The coated side of a sheet of 50 µm polyester film bearing an approximately 25 μm thick layer of 50/50 mixture of "Vitel" PE-207 (a polyester resin available from Goodyear Chem. Inc.) and "Vitel" PE-222 polyester resin (solution coated from methylethyl ketone) was laminated to the UV-exposed surface of the construction in Example 13 by passing the contacted sheets through a hot roll laminator at 114° C. at a rate of 2.5 cm/sec. The sheets were then peeled apart to give results comparable to Example 13.

EXAMPLES 15–19

Metal images were prepared as described in Example 10 using either Carboset 525 (an acrylic resin available from B. F. Goodrich) or Vitel PE-222 as the binder resin and the indicated PR Agent in the imaging layer and 75–125 μm polyester film base bearing the noted vapor deposited materials (Table III).

TABLE III

| Ex. No. | PR Agent (conc.) | Vapor Coating | Exposure |
|---|---|---|---|
| 15 | 4,5-Dimethoxy-2-nitrobenzyl hexadecanesulfonate (4%)[8] | Copper[9] | 5 min.[10] |
| 16 | 4,5-Dimethoxy-2-nitrobenzyl hexadecanesulfonate (3%)[8] | Gold[9] | 2 min.[10] |
| 17 | 4,5-Dimethoxy-2-nitrobenzyl hexadecanesulfonate (3%)[11] | Nickel[9] | 3 min.[10] |
| 18 | N—Octadecyl-O—(4,5-dimethoxy-2-nitrobenzyl)-carbamate (3%)[11,12] | Silicon Monoxide over Aluminum[13] | 2.5 min[14] |
| 19 | N—Methyl-N—(4,5-dimethoxy-2-nitrobenzyl)octadecylamine (3%)[11,15] | Silicon Monoxide over Aluminum[13] | 1.5 min.[12] |

[8]Concentration in acrylic resin available under the trade designation "Carboset" 525
[9]Approximately 500 Å coating
[10]Post-exposure heating step not performed before peeling.
[11]Concentration in polyester resin available under the trade designation "Vitel" PE-222
[12]Coating dried 2 minutes at 60° C. before exposure.
[13]Approximately 150 Å of silicon monoxide vapor deposited over approximately 300 Å of aluminum.
[14]Post-exposure heating 1.5 minutes at 60° C. prior to peeling.
[15]Coating dried 5 minutes at 60° C. before exposure.

EXAMPLE 20

Negative aluminum images on 75 μm thick polyester film were prepared as in Example 13 with a 90 second exposure using a 5 kW Berkey Ascor exposure unit. After hydrophilization of the aluminum images with an 8% solution of sodium metasilicate, an article is obtained that can be used as a plate in an offset lithographic printing press to provide at least two thousand clear impressions.

EXAMPLE 22

By treatment of a negative aluminum image prepared as described in Example 13 with a fluorochemical derivative of salicyclic acid, a plate suitable for preparation of more than 500 impressions in an offset driographic printing press is obtained.

EXAMPLE 23

A sample of clay-filled Kraft paper which has been coated with a vinyl chloride-fluoropolymer coating that is abhesive towards driographic ink was vapor coated with 450 Å of aluminum to give a metal coating which was dull gray in appearance. This surface was coated with a 20% solution of "Carboset" 525 acrylic resin containing 3% 4,5-dimethoxy-2-nitrobenzyl hexadecanesulfonate using a No. 14 coating rod. The sample was allowed to air dry to a tack-free surface, exposed through a lithographic negative to the irradiation from a Berkey Ascor 2 kW unit for 45 seconds, and laminated to a pressure sensitive adhesive tape. On peeling the tape from the filled Kraft paper, an aluminum image (negative of the original) was obtained on the coated paper and a positive image was obtained on the tape. The imaged, coated paper, when inked with a driographic ink, accepted ink in the aluminum areas and was used to make satisfactory impressions.

EXAMPLE 24

A solution of 15% VYNS (high molecular 90/10 weight polyvinyl chloride/polyvinyl acetate strippable resin from Union Carbide) containing 3% of solids of N-methyl-N-(4,5-dimethoxy-2-nitrobenzyl)octadecylamine was coated with a No. 26 coating rod onto silicated-anodized aluminum sheet. The coating was dried five minutes at 60° C. and imaged through a lithographic film original with a Berkey Ascor 2 kW exposure unit for 1.5 minutes. The coating was easily stripped completely from the metal surface with the aid of a sheet of adhesive film, leaving an image in liberated surfactant on the aluminum in irradiated areas. The aluminum surface was inked with a lithographic fountain solution dampened applicator to give ink images in the irradiated areas only.

EXAMPLE 25

A sample prepared as in Example 13 was thoroughly dried by heating in a 50° C. oven and then irradiated through a negative USAF resolution target and a Stouffer Graphic Arts sensitivity guide with sufficient exposure (generally 0.75–1.5 minutes on the Berkey Ascor 2 kW unit) to give a "solid 3" on development (adhesive sheet lamination, 1.5 min. at 55° C., peel). The resolution target produced had a resolution of 7/1 or 143.4 line pairs/mm and an optical density of 2.7–3.0. Images prepared in this manner were suitable for use as exposure masks for the instant as well as other photosensitive materials. The process was also suitable for reversal replication of slide transparencies from conventional silver halide film negatives.

EXAMPLE 26

A 15% solution in methylethyl ketone of "Vitel" PE-222 containing 3% 4,5-dimethoxy-2-nitrobenzyl hexadecanesulfonate and about 0.1% Victoria Blue dye was coated using a No. 26 coating rod onto polyester film, the surface of which had been primed by exposure to a corona discharge. The coating was allowed to air dry and was exposed to the irradiation from a Berkey Ascor 2 kW unit thorugh a negative for 90 seconds. The surface of the resin coating was scored lightly and then laminated with pressure sensitive adhesive tape. On peeling the tape from the polyester, there was revealed a positive image in blue resin on the polyester base and a negative image in blue resin on the tape.

EXAMPLE 27

Example 20 was repeated using 10 to 25% Franconia blue pigment (Imperial A-4431) in place of Victoria Blue dye. Similar positive and negative images were obtained; exposure time, however, was 7 to 10 minutes from the polyester support side of the construction.

EXAMPLE 28

Polyester film (75 μm thick) that had been primed by exposure to corona discharge was coated with a 5% solution in methylethyl ketone of "Vitel" PE-222 polyester resin containing 4% by weight of 4,5-dimethoxy-2-nitrobenzyl hexadecanesulfonate using a No. 8 coating rod. After air drying the coating, a 15% solution in methylethyl ketone containing 25% titanium dioxide was coated thereon using a No. 26 coating rod. The coating was allowed to air dry, the coated surface laminated with pressure sensitive adhesive tape, and exposed to the irradiation from a Berkey Ascor 2 kW unit through a negative from the polyester support side of the construction for 3 to 5 minutes. On peeling the tape from the polyester support, there was revealed a positive image in white on the polyester base and a negative image in white on the tape.

EXAMPLE 29

A sample was prepared as in Example 13 and exposed uniformly with a Berkey Ascor 2 kW exposure unit for three minutes. The coated surface of the sample was then contacted with the front side of a printed paper sheet ("backprint" mode) and passed through the heated rollers of a Thermofax ® unit (thermal imaging device available from the 3M Co.) at ⅓ to ½ maximum speed (3-7 cm/sec at 120°-135° C.). The sample was then separated from the printed original and the surface laminated with an adhesive sheet. On peeling, a replication of the original printed image was obtained on the polyester base with the aluminum image corresponding to the printed image on the paper. The complementary negative image in aluminum was obtained on the adhesive film. Similar results were obtained with a printed transparency original.

We claim:

1. An imaging process comprising:
   (1) providing a support having bonded to one surface thereof an actinic radiation-sensitive layer comprising a blend of:
      (a) actinic radiation-transmissive film-forming polymeric material having adhesion for said support; and
      (b) photolabile blocked surfactant capable upon exposure to actinic radiation of releasing a detectable amount of surfactant in the exposed areas, wherein the adhesion of the actinic radiation-sensitive layer for the support is greater in unexposed areas than in exposed areas;
   (2) exposing said radiation-sensitive layer to actinic radiation in an image-wise pattern at an intensity and for a time sufficient to release an image-wise pattern of released surfactant in the exposed area;
   (3) applying to the surface of the imaged actinic radiation-sensitive layer an adherent layer, wherein the adhesion between said adherent layer and the exposed area of the actinic radiation-sensitive layer is greater than the adhesion between the exposed area of the actinic radiation-sensitive layer and the support and the adhesion between the unexposed area of the actinic radiation-sensitive layer is greater for the support than for the adherent layer, and wherein the cohesion of the actinic radiation-sensitive layer is
      (a) greater than the adhesion between the exposed area of the actinic; radiation-sensitive layer and the support layer;
      (b) greater than the adhesion between the unexposed area and the adherent layer; and
      (c) less than the adhesion between the unexposed area of the actinic radiation-sensitive layer and the support layer; and
   (4) separating the adherent layer from said actinic light sensitive area whereby the unexposed area of said actinic radiation-sensitive layer remains bonded to the support and the exposed area of said actinic radiation-sensitive layer remains adherently bonded to said adherent layer.

2. The process of claim 1 comprising the additional step, after said separating step, of developing said unexposed area or said exposed area.

3. An imaging process comprising:
   (1) providing a four-layered construction comprising an actinic radiation-transmissive support layer having thereon an actinic radiation-sensitive layer which has thereon a frangible layer which is covered by an adherent layer, wherein the various layers are selected of materials such that
      (a) the adhesion between the actinic radiation-sensitive layer and the support layer is less exposed areas than in unexposed areas;
      (b) the adhesion between exposed area of the actinic radiation-sensitive layer and the support layer is less than the adhesion between the frangible layer and the adherent layer;
      (c) the adhesion between the adherent layer and the frangible layer is less than the adhesion between the unexposed area of the actinic radiation-sensitive layer and the support layer;
      (d) the adhesion between the frangible layer and the exposed and unexposed areas of the actinic radiation-sensitive layer is greater than the adhesion between any other layers; and
      (e) the cohesion of the frangible layer is
         (i) greater than the adhesion between the support layer and the exposed area of the actinic radiation-sensitive layer;
         (ii) greater than the adhesion between the frangible layer and the adherent layer; and
         (iii) less than or equal to the adhesion between the actinic radiation-sensitive layer and the frangible layer;
   (2) exposing said actinic radiation-sensitive layer to an image-wise pattern of actinic radiation through said actinic radiation-transmissive support layer; and
   (3) separating said adherent layer from said support layer thereby producing an imaged adherent layer bearing a negative image derived from said frangible layer and an imaged radiation-transmissive support layer bearing a positive image derived from said frangible layer.

4. An imaging process comprising:
   (1) providing a three-layered construction comprising a support layer, an intermediate frangible layer, and an actinic radiation-sensitive layer as defined in claim 1;
   (2) exposing the actinic radiation-sensitive layer in an image-wise pattern to actinic radiation;
   (3) applying an adherent layer to the exposed actinic radiation-sensitive layer; wherein the layers are selected of materials such that
      (a) the adhesion between the actinic radiation-sensitive layer and the frangible layer is greater in unexposed areas than in exposed areas;
      (b) the adhesion between the exposed area of the actinic radiation-sensitive layer and the frangible layer is less than the adhesion between the frangible layer and the support layer;

(c) the adhesion between the unexposed area of the actinic radiation-sensitive layer and the frangible layer is greater than the adhesion between the frangible layer and the support layer; p1 (d) the adhesion between the adherent layer in the exposed and unexposed areas of the actinic radiation-sensitive layer is greater than the adhesion between any other layers; and (e) the cohesion of the frangible layer is such that it separates at the lines defining the image rather than splitting; and (4) separating the support layer from the adherent layer to provide the support layer bearing a negative image derived from said frangible layer and a two-layered construction of the adherent layer bearing the exposed actinic radiation-sensitive layer which has upon its surface a positive image derived from said frangible layer.

5. An imaging process comprising:
(1) providing a three-layered construction having a support layer, an intermediate frangible layer, and an actinic radiation-sensitive layer, as defined in claim 1;
(2) uniformly exposing the actinic radiation-sensitive layer to actinic radiation to provide released surfactant throughout said actinic radiation-sensitive layer;
(3) further exposing the actinic radiation-exposed actinic radiation-sensitive layer to an image-wise pattern of thermal radiation;
(4) applying an adherent layer having adhesion to the exposed and unexposed areas of the actinic radiation-sensitive layers greater than the adhesion between the other layers to the actinic radiation-sensitive layer, said layers being selected such that;
 (a) the adhesion between the frangible layer and the actinic radiation-sensitive layer is greater in the non-thermally exposed area than in the thermally exposed areas;
 (b) the adhesion between the thermally exposed area of the actinic radiation-sensitive layer and the frangible layer is less than the adhesion between the frangible layer and the support layer;
 (c) the adhesion between the non-thermally exposed area of the actinic radiation-sensitive layer and the frangible layer is greater than the adhesion between the frangible layer and the support layer; and
 (d) the cohesion of the frangible layer is greater than;
  (i) the adhesion between the frangible layer and the thermally exposed area of the actinic radiation-sensitive layer and
  (ii) the adhesion between the frangible layer and the support layer;
(5) separating said support layer from said construction thereby to provide an imaged support having a positive image derived from said frangible layer corresponding to the thermally exposed area.

6. An actinic light sensitive sheet construction comprising:
(1) a support;
(2) bonded to one surface of said support an actinic radiation-sensitive layer comprising a blend of
 (a) an actinic radiation-transmissive film-forming polymeric material having adhesion for said support; and
 (b) photolabile blocked surfactant capable of upon exposure to actinic radiation of releasing surfactant in actinic radiation exposed areas; and
(3) a frangible layer adherently bonded between said support and said actinic radiation-sensitive layer wherein the layers are selected of materials such that:
 (a) the adhesion between the actinic radiation-sensitive layer and the frangible layer is greater in unexposed areas than in exposed areas;
 (b) the adhesion between the exposed area of the actinic radiation-sensitive layer and the frangible layer is less than the adhesion between the frangible layer and the support layer;
 (c) the adhesion between the exposed area of the actinic radiation-sensitive layer and the frangible layer is greater than the adhesion between the frangible layer and the support layer; and
 (d) the cohesion of the frangible layer is such that it separates at the lines defining the image rather than splitting.

7. Sheet of claim 6 including an adherent layer bonded to the actinic radiation-sensitive layer, wherein the adhesion between the adherent layer in the exposed and unexposed areas of the actinic radiation-sensitive layer is greater than the adhesion between any other layers.

* * * * *

UNITED STATES PATENT AND TRADEMARK OFFICE
CERTIFICATE OF CORRECTION

PATENT NO. : 4,369,244
DATED : January 18, 1983
INVENTOR(S) : Gilbert L. Eian & John E. Trend It is certified that error appears in the above—identified patent and that said Letters Patent is hereby corrected as shown below:

Col. 3, line 5, "prodess" should read --process--.

Col. 11, line 21, "Dimetnoxy" should read --Dimethoxy--.

Col. 16, line 23, "less exposed" should read --less in exposed--.

Col. 17, line 6, "layer; pl (d) the" should read --layer;

(d) the--.

Signed and Sealed this

Fifth Day of April 1983

[SEAL]

Attest:

Attesting Officer

GERALD J. MOSSINGHOFF
Commissioner of Patents and Trademarks